(12) United States Patent
Saari

(10) Patent No.: US 12,261,617 B2
(45) Date of Patent: Mar. 25, 2025

(54) INTERNALLY CALIBRATED ANALOG-TO-DIGITAL CONVERTER

(71) Applicant: Analog Devices International Unlimited Company, Limerick (IE)

(72) Inventor: Daniel Henrik Saari, Gloucester (CA)

(73) Assignee: Analog Devices International Unlimited Company, Limerick (IE)

( * ) Notice: Subject to any disclaimer, the term of this patent is extended or adjusted under 35 U.S.C. 154(b) by 85 days.

(21) Appl. No.: 18/059,805

(22) Filed: Nov. 29, 2022

(65) Prior Publication Data

US 2024/0178851 A1 May 30, 2024

(51) Int. Cl.
*H03M 1/10* (2006.01)

(52) U.S. Cl.
CPC .................. *H03M 1/1014* (2013.01)

(58) Field of Classification Search
CPC .... H03M 1/1014; H03M 1/1019; H03M 1/12; H03M 1/1038
USPC ......................................... 341/120, 155, 118
See application file for complete search history.

(56) References Cited

U.S. PATENT DOCUMENTS

| 5,319,370 | A | | 6/1994 | Signore et al. |
| 5,822,225 | A | * | 10/1998 | Quaderer ............ H03M 1/1028 702/89 |
| 6,567,022 | B1 | | 5/2003 | Reuveni et al. |
| 7,710,303 | B2 | | 5/2010 | Wojewoda et al. |
| 10,983,546 | B1 | | 4/2021 | Grave et al. |
| 2006/0276986 | A1 | * | 12/2006 | Anderson .......... G01R 31/3167 702/99 |
| 2008/0278359 | A1 | * | 11/2008 | Wojewoda .......... H03M 1/1028 341/141 |
| 2023/0268023 | A1 | * | 8/2023 | Betser ................ H03M 1/1205 365/201 |

FOREIGN PATENT DOCUMENTS

| DE | 102014201833 B4 | 10/2018 |
| EP | 2919023 | 9/2015 |

OTHER PUBLICATIONS

Jamal, Shafiq M, et al., "A 10-b 120-Msample/s Time-Interleaved Analog-to-Digital Converter With Digital Background Calibration", IEEE Journal of Solid-State Circuits, 37(12), (Dec. 2002), 1618-1627.

(Continued)

*Primary Examiner* — Peguy Jean Pierre
(74) *Attorney, Agent, or Firm* — Schwegman Lundberg & Woessner, P.A.

(57) ABSTRACT

An analog-to-digital converter (ADC) system for providing a calibrated voltage measurement without an external reference voltage may include an ADC circuit, including an analog ADC input and a digital ADC output. The ADC system may also include circuitry to generate a first internal reference voltage and a second internal reference voltage. The ADC system may also include circuitry configured to provide a selected output from a number of inputs, wherein the inputs include inputs to receive (1) the first internal reference voltage, (2) the second internal reference voltage, and (3) a user-provided analog signal of interest, wherein the selected output can be connected to the analog ADC input, an external voltage measurement device, or both.

20 Claims, 8 Drawing Sheets

(56) References Cited

OTHER PUBLICATIONS

Li, Dengquan, et al., "A 7b 2.6mW 900MS/s Nonbinary 2-then-3b/cycle SAR ADC with Background Offset Calibration", IEEE Custom Integrated Circuits Conference (CICC), Austin, TX, USA, (Apr. 2019), 4 pgs.

"European Application Serial No. 23212145.9, Extended European Search Report mailed May 3, 2024", 14 pgs.

Dosho, Shiro, "Digital Calibration and Correction Methods for CMOS Analog-to-Digital Converters", IEICE Transactions on Electronics, Institute of Electronics, Tokyo, JP, vol. E95C, No. 4, (Apr. 1, 2012), 421-431.

* cited by examiner

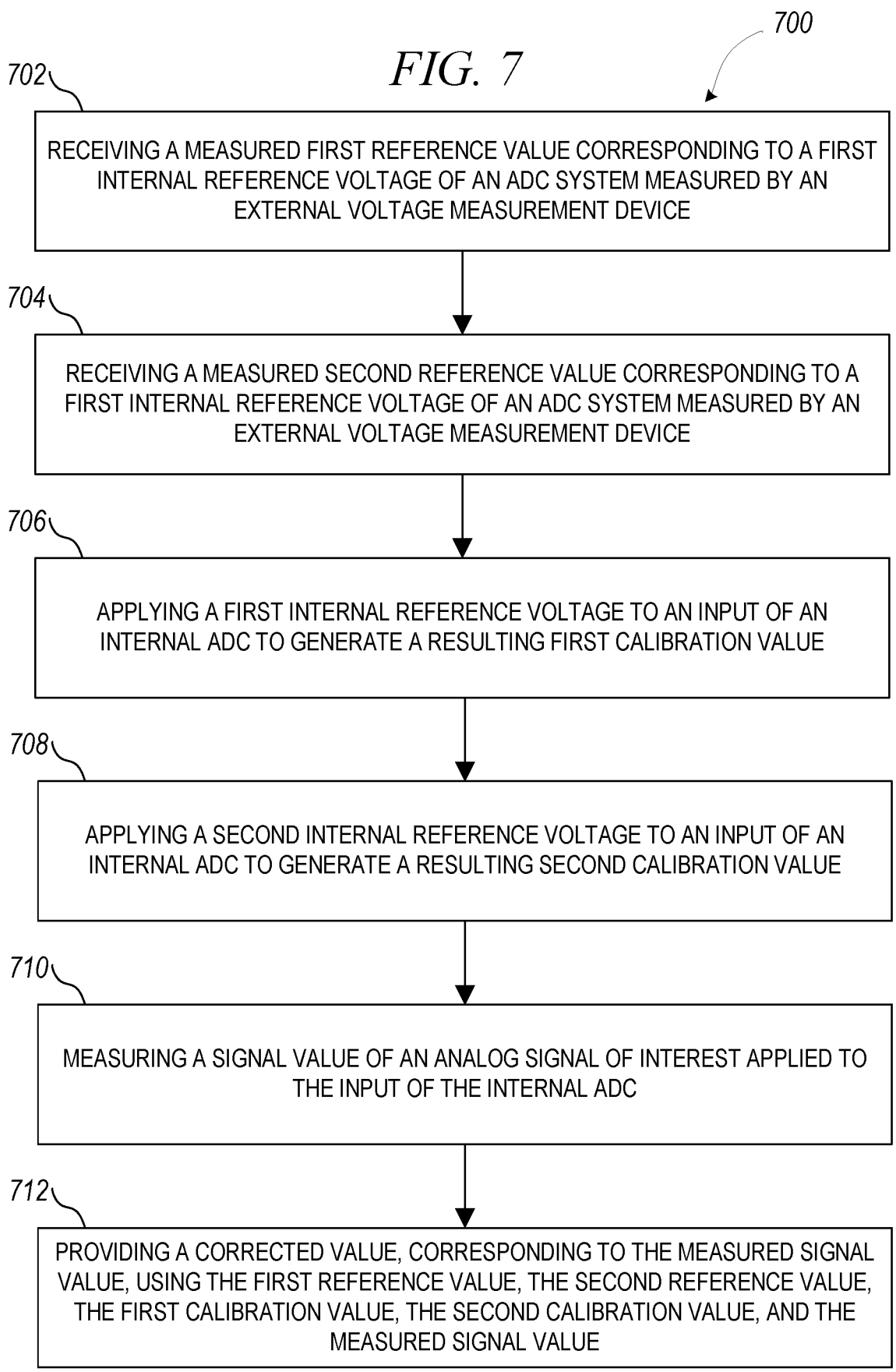

INTERNALLY CALIBRATED ANALOG-TO-DIGITAL CONVERTER

TECHNOLOGICAL FIELD

The present disclosure relates to electronics, and more particularly, but not by way of limitation, to an analog-to-digital converter (ADC) that can be calibrated internally without requiring an external reference.

BACKGROUND

Modern systems can use ADCs to convert an analog signal into a digital signal for processing, storage, or communication. Examples of such modern systems include communication systems, radar systems, measuring systems, and monitoring systems. In these and other modern systems, the accuracy of the ADC may be of interest. Increased accuracy may be helped by calibrating an ADC.

SUMMARY

An ADC may be calibrated to improve the accuracy of a digital output signal conversion of an analog input signal. An ADC calibration may be performed to improve or attempt to improve the accuracy or precision of the ADC by measuring a specified, measured, or calibrated signal value or a consistent signal value.

The ADC being calibrated may be part of an ADC system on a chip, such as an integrated circuit (IC) or soldered printed circuit board (PCB), that can include external pins for connecting to other circuits and hardware. The ADC may receive the specified, measured, or calibrated voltage level as an analog signal through an external pin. The analog signal received through the external pin can be routed to the ADC for calibration purposes. The ADC may not be able to be calibrated using a solely digital communication connection that cannot provide such an analog signal for calibration.

The present inventors have recognized, among other things, that the ADC system may have limited external pins available due to size constraints of the chip or external pin network or cost constraints of the ADC system. This may result in the ADC not being able to receive a specified, measured, or calibrated signal value due to the lack of an available external pin to receive the specified, measured, or calibrated signal value. The ADC system may not be able to receive a specified, measured, or calibrated signal value due to size and cost constraints of the hardware with which the ADC system interfaces. For instance, there can be a lack of external pins to provide a specified, measured, or calibrated signal value, or a lack of means for generating an external specified, measured, or calibrated signal value. Thus, the present inventors have recognized, among other things, that one or more internal specified, measured, or calibrated signal levels can be generated within the ADC system, such as can be useful for calibrating the ADC system. This document describes, among other things, an ADC system that can be calibrated without requiring an external reference signal, such as by using one or more internally generated reference signals.

In an example, a method for operating an analog-to-digital converter (ADC) system may include receiving a measured first reference value corresponding to a first internal reference voltage of the ADC system measured by an external voltage measurement device. The method may also include receiving a measured second reference value corresponding to a second internal reference voltage of the ADC system measured by the external voltage measurement device. The method may also include applying the first internal reference voltage to an input of an internal ADC to generate a resulting first calibration value. The method may also include applying the second internal reference voltage to the input of the internal ADC to generate a resulting second calibration value. The method may also include measuring a signal value of an analog signal of interest applied to the input of the internal ADC. The method may also include providing a corrected value corresponding to the measured signal value, using the first reference value, the second reference value, the first calibration value, the second calibration value, and the measured signal value.

In an example an analog-to-digital converter (ADC) system for providing a calibrated voltage measurement without an external reference voltage may include an ADC circuit, including an analog ADC input and a digital ADC output. The ADC system may also include circuitry to generate a first internal reference voltage and a second internal reference voltage. The ADC system may also include circuitry configured to provide a selected output from a number of inputs, wherein the inputs include inputs to receive (1) the first internal reference voltage, (2) the second internal reference voltage, and (3) a user-provided analog signal of interest, wherein the selected output can be connected to the analog ADC input, an external voltage measurement device, or both.

In an example, a method of operating an analog-to-digital converter (ADC) system with a factory characterization mode and an end-user operational mode may include, during the end-user operational mode, obtaining a reference data set, wherein the reference data set includes a digital representation of one or more internal reference voltages as measured by a voltage measurement device during the factory characterization mode. The method may also include obtaining a measured signal value, wherein the measured signal value is a digital representation of an analog signal of interest obtained by applying the analog signal of interest to an input of an ADC in the ADC system. The method may also include obtaining a calibration data set wherein the calibration data set includes a digital representation of the one or more internal reference voltages obtained by applying the one or more internal reference voltages to the input of the ADC. The method may also include mapping the measured signal value from a curve transecting the calibration data set to a curve transecting the reference data set to obtain a corrected value.

BRIEF DESCRIPTION OF THE DRAWINGS

FIG. 7 is a flow chart showing an example of a method for operating portions of an ADC system.

DETAILED DESCRIPTION

Figure 1:
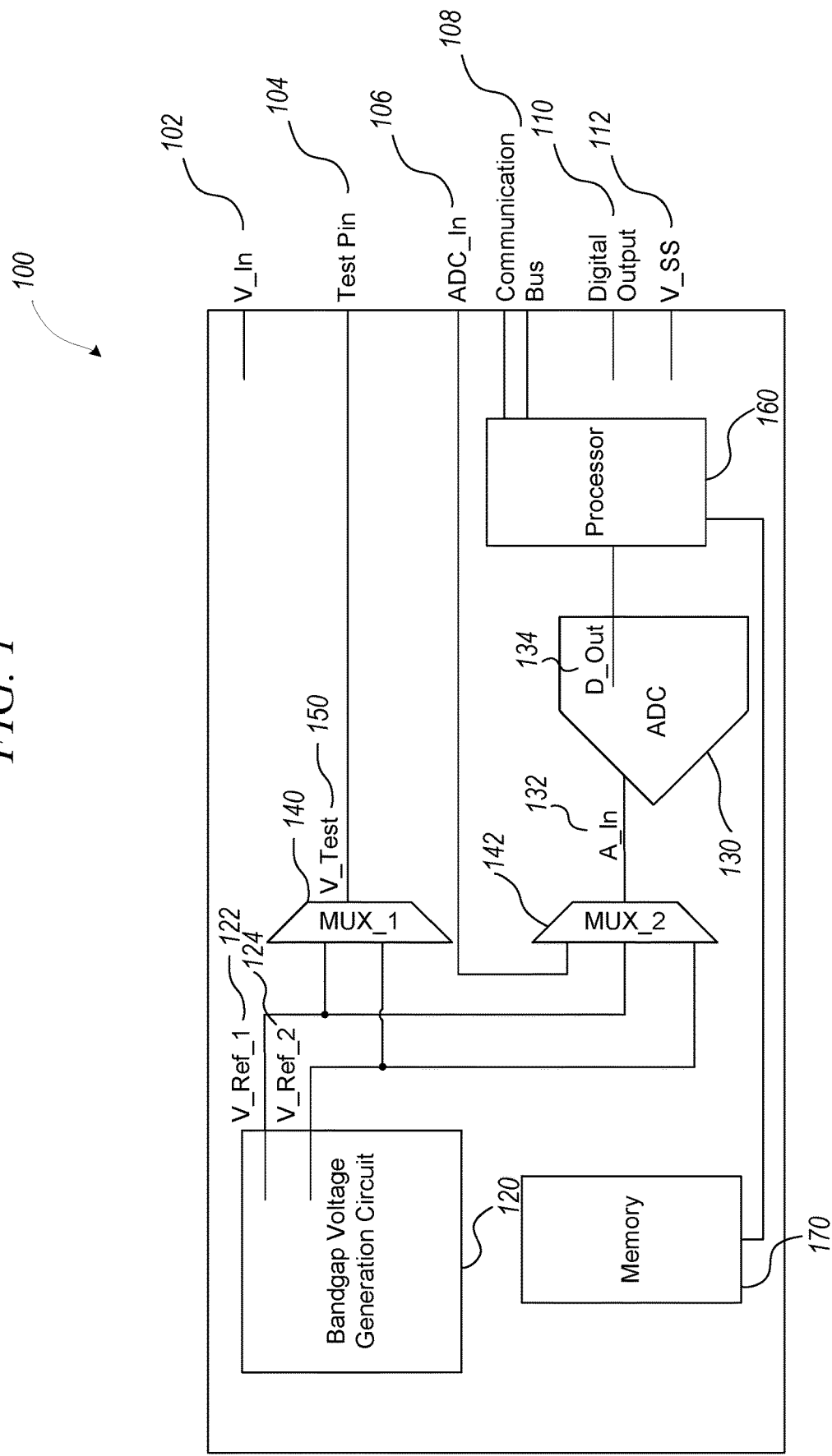
FIG. 1 is a schematic drawing of an example of portions of an ADC system.

The present disclosure relates to an analog-to-digital converter (ADC) system that can be calibrated without requiring an external reference, such as can include using one or more internal references.

An ADC system may receive an analog input signal, such as a current or voltage signal. The ADC system can generate a digital output signal corresponding to or representing the analog input signal. The resulting digital output signal value may be used in a variety of calculations or operations in the digital domain. It may be desirable for an ADC system to be calibrated, such as to an absolute standard. With calibration, for a given digital output signal value, the corresponding absolute analog input signal value can be determined. It may be desirable for an ADC system to be calibrated to a relative standard. When calibrated to a relative standard, for a given analog input signal value, the digital output signal value is consistent across multiple measurements over time. Absolute calibration or relative calibration can help improve the accuracy or precision of a measurement. Such improved accuracy may be desired to better understand past events or better predict future events.

A relative calibration may use a consistent calibration reference having a consistent or substantially consistent analog signal value. The consistent calibration reference may not have a specified, measured, or calibrated absolute value, but may be consistent or vary only within an acceptable range over time. In this way, through periodic or other repeated measurements of the consistent calibration reference, an ADC system can adjust to generate the same digital output signal value for the consistent calibration reference value. In an example, a bandgap reference circuit may be used to provide a consistent calibration reference, due to the bandgap reference's stability over time and at various operating conditions, such as temperature.

An absolute calibration may use an absolute calibration reference of a specified, measured, or calibrated absolute analog signal value, or within a certain tolerance of an absolute analog signal value. The absolute calibration reference may be generated by a system that is capable of producing a specified absolute analog signal value of a given tolerance. The absolute calibration reference may be generated by measuring the absolute value of a given analog signal contemporaneously or near in time with the calibration measurement of the given analog signal value by the ADC system. Following the absolute measurement and calibration measurement, the absolute measurement value can be used to calibrate the ADC system. The absolute calibration reference may also be generated by measuring the absolute value of an analog signal that is believed to be consistent over time, such as a consistent calibration reference. Then, the consistent calibration reference can be considered to be an absolute calibration reference having the measured absolute value.

An ADC system may include one or more consistent calibration references, such as bandgap references, that are generally or substantially consistent over time, over temperature, and over other variations. The calibration reference may provide a relative calibration due to its consistency. Or, the calibration reference may be configured to have a specific signal value and may therefore provide an absolute calibration or quasi-absolute calibration. The ADC system may undergo a factory characterization while the ADC system is in a factory characterization mode, such as during manufacturing or after manufacturing. The factory characterization mode can be used to determine an absolute value of the calibration references, and to allow for absolute calibration of the ADC system. The factory characterization mode may be completed once in the life of the ADC system, or multiple times. The factory characterization may improve the accuracy of the ADC system. For example, the factory characterization may provide an accuracy greater than an ADC system that has not undergone a factory characterization to measure the absolute value of the ADC system's internal references.

During the factory characterization mode, the ADC system may supply the calibration references for measuring by a precision external measurement device. The calibration references may be provided through temporarily borrowed pins or multi-purpose test pins such as to decrease the number of pins on the ADC system 100.

FIG. 1 is a schematic drawing of an example of portions of an ADC system 100. In the example of FIG. 1, the ADC system 100 may include a bandgap voltage generation circuit 120, an internal ADC 130, a processor 160, a memory 170, a first multiplexer 140, and a second multiplexer 142. The ADC system 100 may include a number of external pins such as a voltage input pin 102, test pin 104, ADC input pin 106, communication bus connections 108, digital output pin 110, and ground pin 112.

The bandgap voltage generation circuit 120 may include as outputs a first reference voltage 122 and a second reference voltage 124. The first reference voltage 122 and the second reference voltage 124 may be connected to the first multiplexer 140 and the second multiplexer 142. The bandgap voltage generation circuit 120 may generate the first reference voltage 122 and the second reference voltage 124 using bandgap voltage generation circuitry.

The internal ADC 130 may include an analog signal input 132 and a digital signal output 134. The internal ADC 130 may convert the analog signal input 132 into the digital signal output 134 using analog-to-digital conversion circuitry employing a conversion technique such as delta-sigma, successive approximation, flash, or integration. The analog signal input 132 may be selected by the second multiplexer 142 from a number of options such as the first reference voltage 122, the second reference voltage 124, or the ADC input pin 106. The digital signal output 134 may include a number of bits for providing a given resolution, such as 8, 10, 12, 14, 16, or 32 bits. The digital signal output 134 may have a precision equaling the bit resolution of the internal ADC 130, or the digital signal output 134 may have a precision that is less than the bit resolution of the internal ADC 130. In an example, the internal ADC 130 may be a differential ADC that compares the analog signal input 132 to a reference voltage. The reference voltage may be provided by a ground or neutral voltage, a supply voltage, or a dedicated ADC reference voltage. The input range of the analog signal input 132 may start at 0V, or may be offset to start above 0V, such as at 5V. The internal ADC 130 may be designed so that the upper range of the analog signal input 132 may take on any value, such as 5V, 10V, 20V, or 100V. The input range of the ADC may be 0V to 3.63V.

The processor 160 may be connected to the digital signal output 134 of the internal ADC 130 and may be connected to the communication bus connections 108. The processor 160 may receive the digital signal output 134 for further processing such as filtering, smoothing, calibrating, or adjusting. The processor 160 may send the raw value or a processed value of the digital signal output 134 using the communication bus connections 108.

The memory 170 may include one or more storage mediums such as random access memory (RAM) or direct access memory. The one or more storage mediums may be volatile, losing their stored data when power is lost, or non-volatile, maintaining their stored data when power is lost. The one or more storage mediums may be read-only or writable. The memory 170 may be connected to the processor 160 for use in various processor operations, such as storing and retrieving information or data.

The processor 160 may also control the first multiplexer 140 and the second multiplexer 142. The processor 160 may perform a number of other operations related to the analog-to-digital conversion of signals as well as operations unrelated to the analog-to-digital conversions, such as controlling the digital output pin 110.

The first multiplexer 140 may have inputs including the first reference voltage 122 and the second reference voltage 124. The first multiplexer 140 may provide a single selected input as the test voltage output 150. The test voltage output 150 may be connected to the test pin 104. The test voltage output 150 may be connected to the test pin 104 through a hardwire or permanent connection, or the test voltage output 150 may be connected to the test pin 104 temporarily using one or more multiplexers or switching devices. The first multiplexer 140 may be controlled by the processor 160, hardwire internal circuitry, or an external device, such as through the communication bus connections 108.

The second multiplexer 142 may have inputs including the first reference voltage 122 the second reference voltage 124 and the ADC input pin 106. The second multiplexer 142 may provide a single selected output as the analog signal input 132 to the internal ADC 130. The second multiplexer 142 may be controlled by the processor 160, hardwire internal circuitry, or an external device, such as through the communication bus connections 108.

The voltage input pin 102 may provide the operating voltage for one or more components of the ADC system 100. The voltage input pin may accept a direct current (DC) voltage or an alternating current (AC) voltage. The voltage input pin 102 may accept a single voltage or a range of voltages. Internal circuitry of the ADC system 100 may convert the voltage from the voltage input pin 102 to one or more other voltages for use by the ADC system 100. In an example, the voltage input pin 102 accepts a voltage range of 3-24V DC and converts this voltage to 3.3V DC and 5V DC.

The ground pin 112 may be connected to a ground or neutral of a power supply used to provide power to the voltage input pin 102. The ground pin 112 may be connected to an earth ground, or the ground pin 112 may be floated or isolated from earth ground. The ground pin 112 may provide a reference value for various voltages in the ADC system 100. The ground pin 112 may provide a return path for current entering the voltage input pin 102.

The test pin 104 may be connected to an external measurement or test device, such as during a factory characterization mode, a factory calibration, or a test. The test pin 104 may be connected to the test voltage output 150 and may output various internal values, such as first reference voltage 122 and second reference voltage 124, using internal switching and multiplexing devices. The test pin 104 may not be a physical pin, but rather one or more pins that are repurposed during calibration for testing purposes. In an example, the ADC input pin 106 or the digital output pin 110 may be repurposed as the test pin 104 during calibration or testing. The test pin 104 may provide the first reference voltage 122 and the second reference voltage 124 to an external voltage measurement device during a factory characterization mode to determine the absolute value of the first reference voltage 122 and the second reference voltage 124 to allow for absolute calibration of the ADC system 100.

The ADC input pin 106 may be connected to an input of the second multiplexer 142 for routing to the analog signal input 132 of the internal ADC 130 when selected. The ADC input pin 106 may carry an analog signal of interest. The analog signal of interest may have a signal value, and the ADC system 100 may operate to measure and return a digital representation of the signal value of the analog signal of interest.

The communication bus connections 108 may include one or more pins for carrying an analog or digital communication signal. The communication may be according to a standardized communication format or may utilize a proprietary communication format. The communication bus connections 108 may utilize a serial form of digital communication. The communication bus connections 108 may be connected to another chip, circuit, or device.

Figure 2:
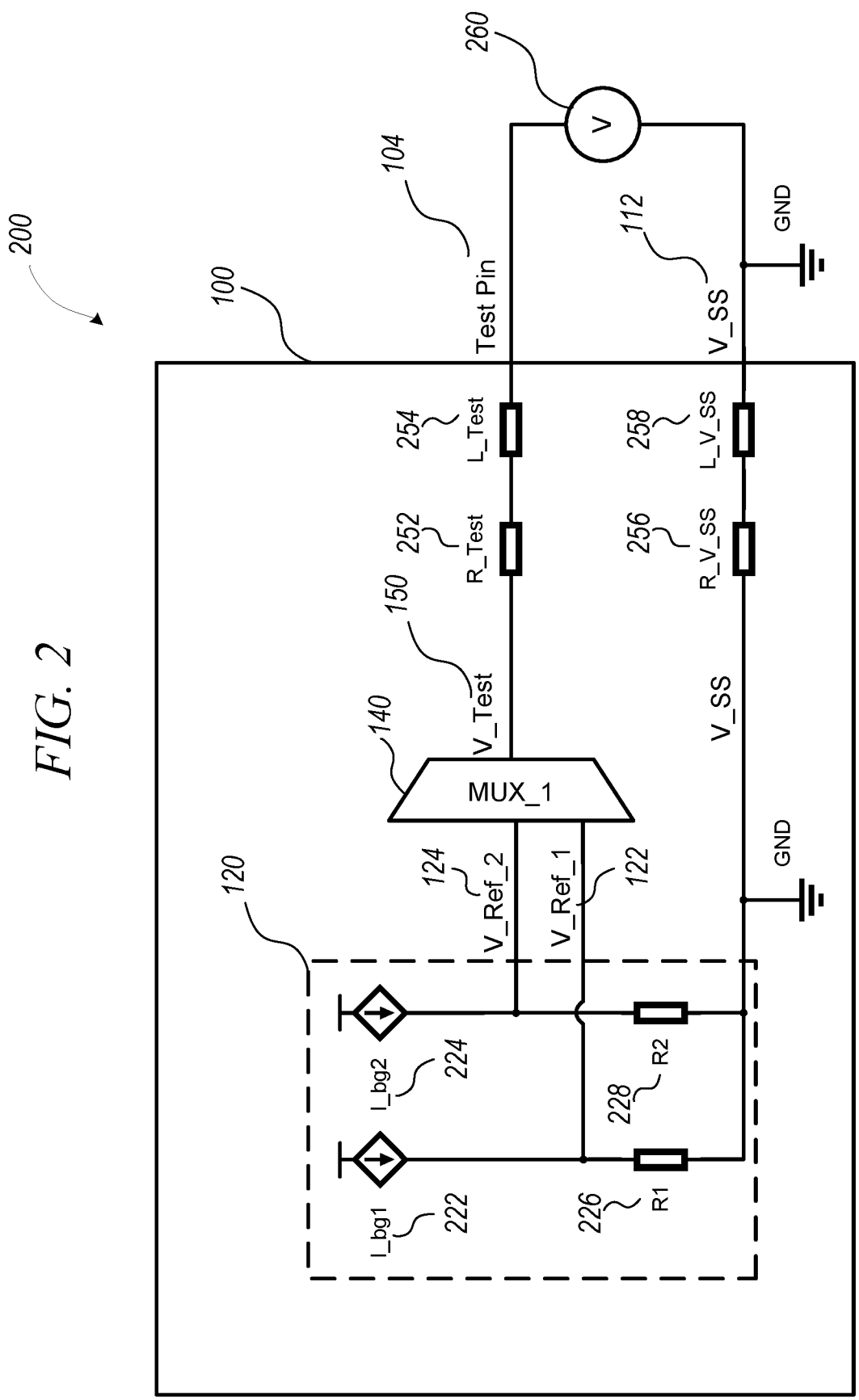
FIG. 2 is a schematic drawing of an example of portions of an ADC system and an example of a portion of an external system connected to the ADC system.

FIG. 2 is a schematic drawing 200 of an example of portions of an ADC system 100 and an example of a portion of an external system 260 connected to the ADC system 100. In the example of FIG. 2, the ADC system 100 may include a bandgap voltage generation circuit 120, a first multiplexer 140 a test bond wire resistance 252, a test bond wire inductance 254, a ground bond wire resistance 256, a ground bond wire inductance 258, a test pin 104, and a ground pin 112. The ADC system 100 may be the same ADC system 100 depicted in part in FIG. 1, or it may differ from the ADC system 100 of FIG. 1 in one or more ways.

The external system 260 may be a measurement instrument or device, such as a voltage measurement device or a current measurement device. In an example, the external system 260 may be a precision voltage ADC or a precision voltmeter. The external system 260 may receive the first reference voltage 122 or the second reference voltage 124 through the first multiplexer 140 connected to the test pin 104. The external system 260 may measure the voltage value on the test pin 104 and provide a digital representation of the voltage value on the test pin 104. The digital representation of the voltage value may be stored in the memory 170 for retrieval during calibration. The external system 260 may have a precision or resolution that exceeds the precision or resolution desired from the ADC system 100. The external system 260 having a precision exceeding the precision of the ADC system 100 may allow the ADC system 100 to be calibrated within the bit resolution of the internal ADC 130. The external system 260 may have an ADC with a larger number of bits than the internal ADC 130. The external system 260 may have a finer accuracy or resolution than the internal ADC 130. A desired accuracy of the internal ADC 130 may be within 20 mV of the measured signal value, and the accuracy of the external system 260 may be within this accuracy, such as within 10 mV of the measured signal value.

The bandgap voltage generation circuit 120 may include a first bandgap current source 222, a second bandgap current source 224, a first bandgap voltage generation resistor 226, and a second bandgap voltage generation resistor 228.

The first bandgap current source 222 may be generated by the same bandgap voltage reference or different references. The low side of the first bandgap voltage generation resistor 226 and the second bandgap voltage generation resistor 228 may be connected to the ground pin 112

The first bandgap current source 222 may be passed through the first bandgap voltage generation resistor 226, and thereby generate a first reference voltage 122 on the high side of the first bandgap voltage generation resistor 226. The first reference voltage 122 may be equal to the multiplication of the value of the first bandgap current source 222 and the value of the first bandgap voltage generation resistor 226 (V_Ref_1=R1*I_bg1).

The second bandgap current source 224 may be passed through the second bandgap voltage generation resistor 228 and thereby generate a second reference voltage 124 on the high side of the second bandgap voltage generation resistor 228. The second reference voltage 124 may be equal to the multiplication of the value of the second bandgap current source 224 and the value of the second bandgap voltage generation resistor 228 (V_Ref_2=R2*I_bg2).

The first bandgap current source 222, second bandgap current source 224, first bandgap voltage generation resistor 226, and second bandgap voltage generation resistor 228, may be selected or tuned so that the first reference voltage 122 and the second reference voltage 124 have a selected value, or a value very close to a selected value. The first reference voltage 122 and the second reference voltage 124 may have the same or a similar value, or they may be selected to be of a different value. The first reference voltage 122 and the second reference voltage 124 can be selected to span a portion of the full-scale range of the internal ADC 130, such as 10% to 90%, 50% to 80%, at least 20%, at least 40%, at least 60%, at least 80% or at least 90% of the full-scale range. In an example, the full-scale range of the internal ADC 130 is 0V to 3.63V and the first reference voltage 122 has a value of 0.5V and the second reference voltage 124 has a value of 2.0V.

In an example, the bandgap voltage generation circuit 120 may only generate a single voltage. In an example, the bandgap voltage generation circuit 120 may generate 3 or more voltages. The schematic drawing 200 of FIG. 2 shows a method of generating the first reference voltage 122 and the second reference voltage 124 using bandgap voltage sources and resistors, but there may be a number of other ways of generating reference voltages. In an example, the bandgap voltage generation circuit 120 may be substituted for by another voltage generation circuit that can be configured to generate one or more references without using a bandgap reference.

The test bond wire resistance 252 and test bond wire inductance 254 may represent a resistance and an inductance respectively of the test pin 104 and the circuitry connecting the test pin 104 to the first multiplexer 140. The ground bond wire resistance 256, and ground bond wire inductance 258 may represent a resistance and an inductance respectively of the ground pin 112 and the circuitry connecting the ground pin 112 to the low sides of the first bandgap voltage generation resistor 226 and the second bandgap voltage generation resistor 228.

The external system 260 may receive a value of or measure one or more of the test bond wire resistance 252, test bond wire inductance 254, ground bond wire resistance 256, and ground bond wire inductance 258 and may adjust the digital representation of the voltage value on the test pin 104 to account for one or more of the inductance or resistance values. The external system 260 may adjust for one or more of a resistance or an inductance of test leads connecting the external system 260 to the ADC system 100.

Figure 3:
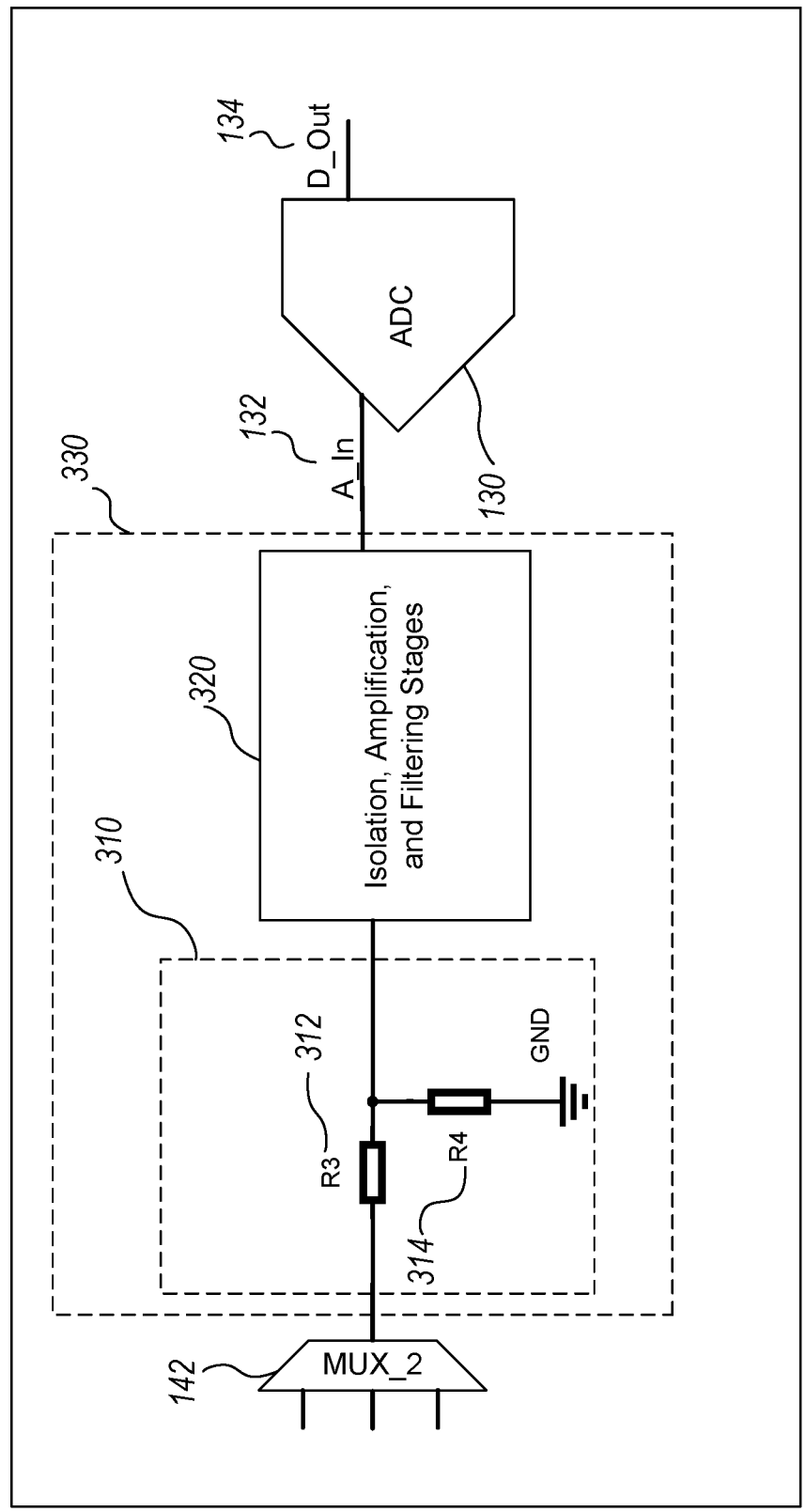
FIG. 3 is a schematic drawing of an example of portions of an ADC system.

FIG. 3 is a schematic drawing 300 of an example of portions of an ADC system 100. In the example of FIG. 3, the ADC system 100 may include a second multiplexer 142, an ADC signal chain 330, and an internal ADC 130. The ADC signal chain 330 may include a first stage 310, and one or more additional stages 320.

The first stage 310 may act as an input stage for the internal ADC 130. The first stage 310 may include a first input resistor 312, and a first ground resistor 314. The first input resistor 312 may be connected between the output of the second multiplexer 142 and an input of the one or more additional stages 320. The first ground resistor 314 may be connected between ground on one end and between the first input resistor 312 and an input to the one or more additional stages 320 on the other end.

The first input resistor 312 may provide an input impedance for the ADC signal chain 330 to one or more of reduce a maximum current, reduce inrush current, provide a given resistor-capacitor time constant, or fulfill another design objective. The first ground resistor 314 may provide a resistive path to ground to one or more of provide a filtering effect, provide a drain path for voltage or charge, or fulfill another design objective.

The one or more additional stages 320 may be selected to include one or more isolation stages, one or more amplification stages, or one or more filtering stages. In an example, the one or more additional stages 320 may include capacitors that are charged through the first stage 310 during an ADC input cycle, and switches to isolate the one or more additional stages 320 from the first stage 310 after the ADC input cycle.

Figure 4:
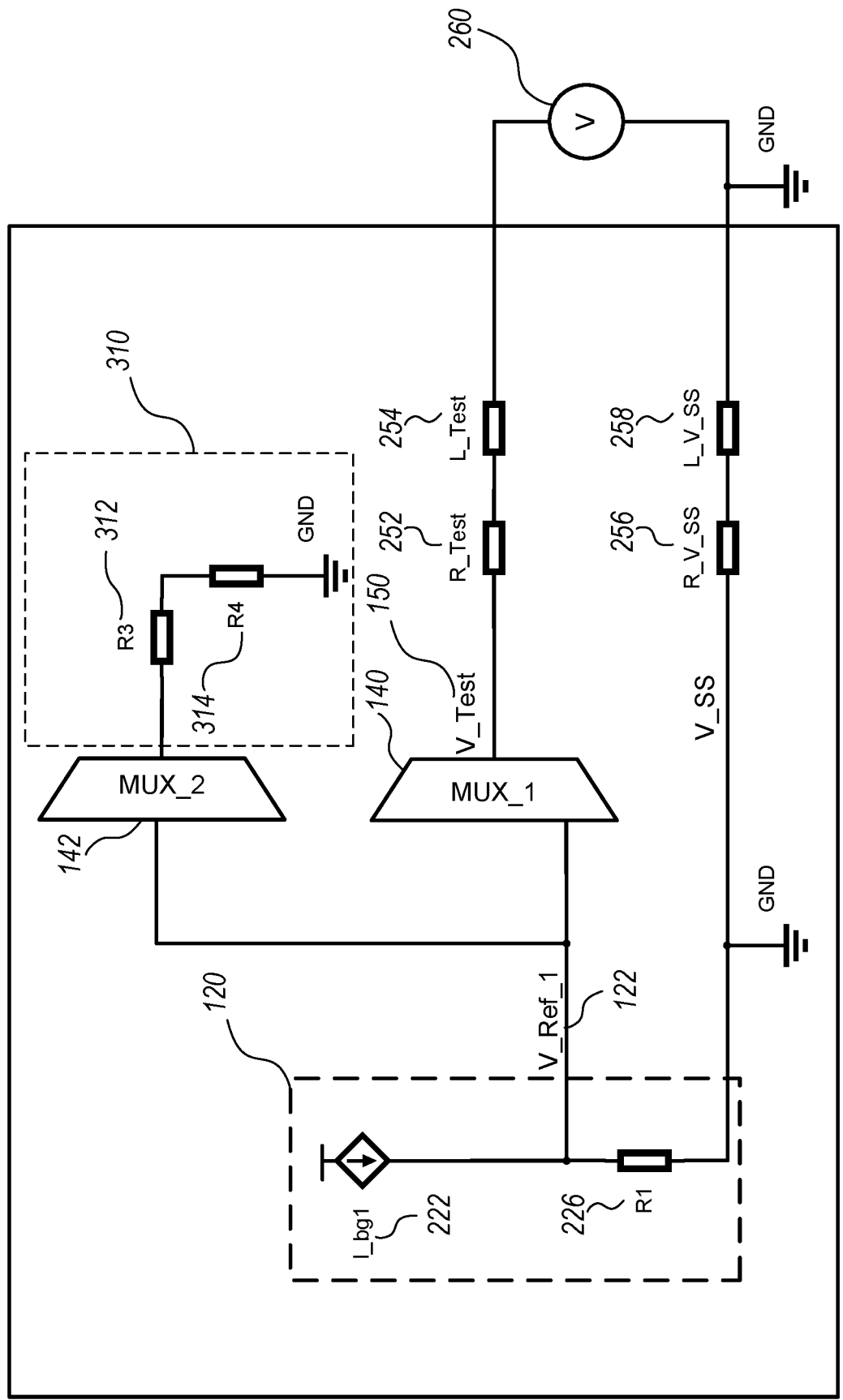
FIG. 4 is a schematic drawing of an example of portions of an ADC system and an example of a portion of an external system connected to the ADC system.

FIG. 4 is a schematic drawing of an example of portions of an ADC system 100 and an example of a portion of an external system 260 connected to the ADC system. In the example of FIG. 4, the ADC system 100 may include a first stage 310 of an ADC signal chain 330, a second multiplexer 142, a first multiplexer 140, and portions of a bandgap voltage generation circuit 120.

When the second multiplexer 142 selects the first reference voltage 122 to output to the first stage 310, the value of the first reference voltage 122 may change. For example, the value of the first reference voltage 122 may change due to the first input resistor 312 and the first ground resistor 314 providing an additional path to ground for the first bandgap current source 222. In an example, this additional path to ground may lower the total resistance to ground seen by the first bandgap current source 222 and therefore may lower the first reference voltage 122. When the second multiplexer 142 selects the first reference voltage 122, the first input resistor 312 and the first ground resistor 314 are connected in series with each other to ground, and as a group in parallel with the first bandgap voltage generation resistor 226 to ground. This may change the total resistance to ground seen by the first bandgap current source 222 from R1 to:

$$R1 || (R3 + R4) = \frac{R1 * (R3 + R4)}{R1 + R3 + R4}$$

The total resistance may decrease, and as a result, the value of the first reference voltage 122 may decrease, which may result in the value of the first reference voltage 122 measured by the internal ADC 130 being lower than an open circuit value of the first reference voltage 122.

The factory characterization mode may compensate or adjust for this decrease in the value measured by the internal ADC 130 by connecting the internal ADC 130 to the first reference voltage 122 in parallel with the external system 260. This may result in the value of the first reference voltage 122 measured by the external system 260 matching or more closely matching the value of the first reference voltage 122 measured by the internal ADC 130. This may allow the ADC system 100 to achieve a calibration that is closer to an absolute calibration than would be achieved by measuring the first reference voltage 122 without connecting the first stage 310 of the internal ADC 130 in parallel with the external system 260. The factory characterization mode may account for the variability in the construction of the reference voltages which may lead to varying values of the first reference voltage 122 and the second reference voltage 124. The factory characterization mode may account for variability in the construction of the internal ADC 130, which may lead to varying values of the first input resistor 312 and the first ground resistor 314. The input impedance of the external system 260 may be large and therefore only have a minimal effect on the measured voltage.

Figure 5:
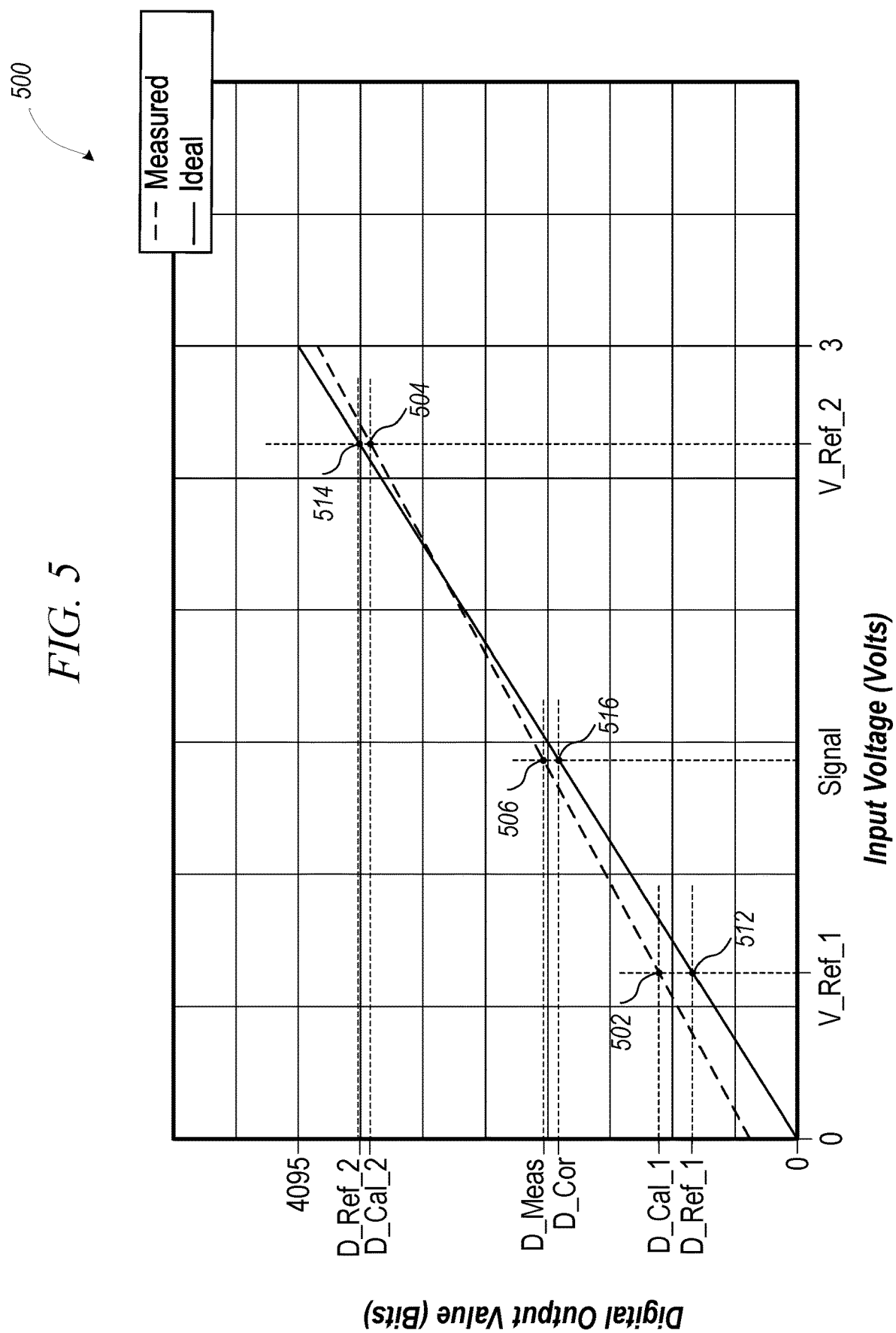
FIG. 5 is an example of a graph showing conversion of an analog voltage level to a digital representation, including an example of a measured curve and an example of an ideal curve.

FIG. 5 is an example of a graph 500 showing conversion of an analog voltage level to a digital representation, including an example of a theoretical measured curve and an example of a calculated ideal curve. In the example of FIG. 5, the internal ADC 130 may have a full-scale analog signal input 132 voltage range of 0V to 3V, and may be a 12-bit ADC having a digital signal output 134 range from 0 to 4095 bits, for a total of 2^12 possible output values.

The ideal curve may represent a desired function of an ADC, may be linear or substantially linear, and may span the entire range of both analog signal input 132 and the digital signal output 134. The ideal curve may convert an analog signal input 132 value of 0 volts to a digital signal output 134 value of 0 bits. The ideal curve may convert an analog signal input 132 value of 3 volts to a digital signal output 134 of 4095 bits. The ideal curve may convert analog signal input 132 value to digital signal output 134 according to the following ideal ADC curve equation:

$$\text{Digital Output (Bits)} = (2^N - 1) * \left(\frac{V_{in}}{V_{fs}}\right) = 4095\left(\frac{V_{in}}{3}\right)$$

where N is the number of bits of the ADC, V_in is the input voltage, and V_fs is the full-scale resolution of the ADC. Because the digital signal output 134 value may be limited to integer values, the internal ADC 130 may one or more of round to the nearest number, take a floor value by discarding any remainder, or take a ceiling value by rounding up any remainder.

The measured may represent the output function of an ADC, such as the internal ADC 130. The measured curve may be linear or substantially linear, or it may be non-linear due to one or more of an ADC design decision, an ADC design defect, an ADC manufacturing error, an ADC operating condition, or one or more other reasons. The measured curve may convert an analog signal input 132 value of 0 volts to a digital signal output 134 value that is not equal to 0 bits, such as approximately 400 bits in the example of FIG. 5. In an example, the internal ADC 130 may produce a digital signal output 134 value of 0 bits when the analog signal input 132 value is still greater than 0V but at the low-level saturation value of the internal ADC 130, which may result in the internal ADC 130 not being able to measure values between 0V and the low-level saturation value. The measured curve may convert an analog signal input 132 value or 3 voltages to a digital signal output 134 value that is not equal to 4095 bits, such as approximately 3850 bits in the example of FIG. 5. In an example, the internal ADC 130 may produce a digital signal output 134 value of 4095 bits when the analog signal input 132 is less than 3V but at a high-level saturation value of the internal ADC 130, which may result in the internal ADC 130 not being able to measure values between the high-level saturation value and 3V.

The resolution of the internal ADC 130 may be reduced due to a non-ideal nature of the measured curve. In the example of FIG. 5, the resolution may be reduced from 4096 different bit values to about 3450 different bit values (3850-400). In an example, the resolution of the internal ADC 130 may be increased due to a non-ideal nature of the measured curve, but the full-scale range may be decreased.

It may be desirable to correct or calibrate the measured ADC curve toward the ideal ADC curve. For example, it may be desirable to adjust a digital signal output 134 value of the internal ADC 130 for a given analog signal input 132 value towards the digital signal output 134 value that would have been given by an ideal ADC for the same digital signal output 134 value. In order to calibrate an ADC, it may be desirable to have one or more reference voltage values having a specified, measured, or calibrated value, or a value within a degree of error of a specified, measured, or calibrated value. If the ideal curve and the measured curve are linear or substantially linear, a first reference value and a second reference value may allow for a calibration of the measured curve towards the ideal curve. Each point on the measured line may be converted or mapped to a point on the ideal line to provide the corrected or calibrated output value.

A first internal reference voltage may be provided by the first reference voltage 122 and a second internal reference voltage may be provided by the second reference voltage 124. The first reference voltage 122 may have a specified, measured, or calibrated first reference value V_Ref_1, which may be converted to a digital representation, D_Ref_1, according to the ideal ADC curve equation. The ideal ADC curve may pass through or transect D_Ref_1 and V_Ref_1 at point 512. The second reference voltage 124 may have a specified, measured, or calibrated second reference value V_Ref_2 which may be converted to a digital representation, D_Ref_2, according to the ideal ADC curve equation. The ideal ADC curve may pass through or transect D_Ref_2 and V_Ref_2 at point 514. The first reference voltage 122 may be applied to an analog signal input 132 of the internal ADC 130 to generate a first digital calibration value D_Cal_1 where the measured curve meets V_Ref_1 at point 502. The second reference voltage 124 may be applied to an analog signal input 132 of the internal ADC 130 to generate a second digital calibration value D_Cal_2 where the measured curve meets V_Ref_2 at point 504. An analog signal of interest provided to the ADC input pin 106 may be applied to an analog signal input 132 of the internal ADC 130 to generate a digital measured signal value D_Meas where the measured curve meats the signal value at point 506. The measured ADC curve may pass through or transect 502, 504, and 506 and may be generally or substantially linear.

The digital measured signal value, D_Meas, may be converted to a corrected or calibrated digital signal value, D_Cor, such as by mapping D_Meas from the measured ADC curve at point 506 to the ideal ADC curve at point 516. The correction may be performed by calculating at least one of an intercept correction or a slope correction between the measured ADC curve and the ideal ADC curve. The slope or gain correction, M, may be calculated according to the following equation:

$$M = \frac{D_{Ref_2} - D_{Ref_1}}{D_{Cal_2} - D_{Cal_1}}$$

The intercept or offset correction, B, may be calculated according to the following equation:

$$B = D_{Ref_1} - M * D_{cal_1}$$

The corrected digital signal value, D_Cor, may be calculated according to the following equation:

$$D_{cor} = M * D_{Meas} + B$$

The corrected digital signal value, D_Cor may be converted to an analog value of the measured signal of interest, V_Meas, using the following equation:

$$V_{Meas} = V_{FS} * \frac{D_{Cor}}{2^N - 1}$$

The first reference voltage 122 and the second reference voltage 124 may have a specified, measured, or calibrated value that was measured during a factory characterization mode using the external system 260. The specified, measured, or calibrated values may be stored in memory 170 for retrieval during the end-user operational mode during which the first digital calibration value and second digital calibration value are measured. In an example, the reference values are measured once during the life of the ADC system 100 during a factory characterization mode, and the calibration values are also measured once during the factory characterization mode. In an example, the calibration values are measured periodically during a post-manufacturing end-user operational mode to periodically calibrate the ADC. In an example, the calibration values are measured at least once every 1 microsecond, 5 microseconds, 10 microseconds, 50 microseconds, 100 microseconds, 200 microseconds, 500 microseconds, 1 millisecond, or 10 milliseconds. In an example the measuring of the calibration values occurs at least once for every time an analog signal of interest is measured. In an example, the measuring of the calibration values occurs at least once for every 10, 100, 1000, 5000, 10,000, or 100,000 times an analog signal of interest is measured. The calibration may be able to correct or cancel part or all of the 1/f noise of the internal ADC 130. The calibration may be able to correct or cancel at least one of offset or gain drift over time. In an example, the internal ADC 130 may be adjusted in response to a calibration measurement to move the measured curve closer to the ideal curve.

The calibration calculations may be performed using software in a software-based processor. The calibration calculations may be performed, at least in part, in hardware-based calibration circuitry. In an example, the values measured during the factory characterization mode may be stored as floating point numbers and converted to digital values during calibration. In an example, the values measured during the factory characterization mode may be stored as digital numbers corresponding to the digital output values of the ideal ADC curve for the first reference voltage 122 and the second reference voltage 124.

The calibration calculations may be performed in a bit resolution that is equal to the bit resolution of the internal ADC 130. The calibration calculations may be performed in a bit resolution that is less than the bit resolution of the internal ADC 130. Performing the calibration calculations in a lower bit resolution may one or more of conserve power or conserve hardware resources. In an example, the internal ADC 130 may have 12 bits of resolution, and the calibration calculations may be performed, at least in part, using one or more of 8-bit or 10-bit logic. The internal ADC 130 may have a lower effective bit resolution than the true bit resolution of the internal ADC 130, such as may be due to the nonlinearity of a portion of the internal ADC 130. In an example, the effective bit resolution of the internal ADC 130 may be bits and the true bit resolution may be 12 bits. The difference in effective bit resolution and true bit resolution may affect the bit resolution of the calibration calculations, such as by allowing for a lower bit resolution of calibration calculations without losing accuracy.

In an example, the ADC calibration may be performed with a single reference voltage, such as a first reference voltage 122, and may result in one of an intercept or offset correction. In an example, the ADC calibration may be performed with more than two reference voltages, such as 2, 3, 4, 5, 6, or N voltages, where N represents an integer greater than 6. The ADC calibration performed with more than two reference voltages may use a regression technique, such as a linear regression to determine a measured line from the three or more calibration points. An ADC calibration performed with three or more reference voltages may not map a measured line to an ideal line, but may determine a measured curve and an ideal curve, where the measured curve and ideal curve may not be linear. The measured curve may transect each of the measured calibration points. In an example, the calibration may map a non-linear measured curve to a linear or substantially linear ideal curve. Calibration may be able to correct or adjust for a non-linearity in the internal ADC 130.

Figure 6B:
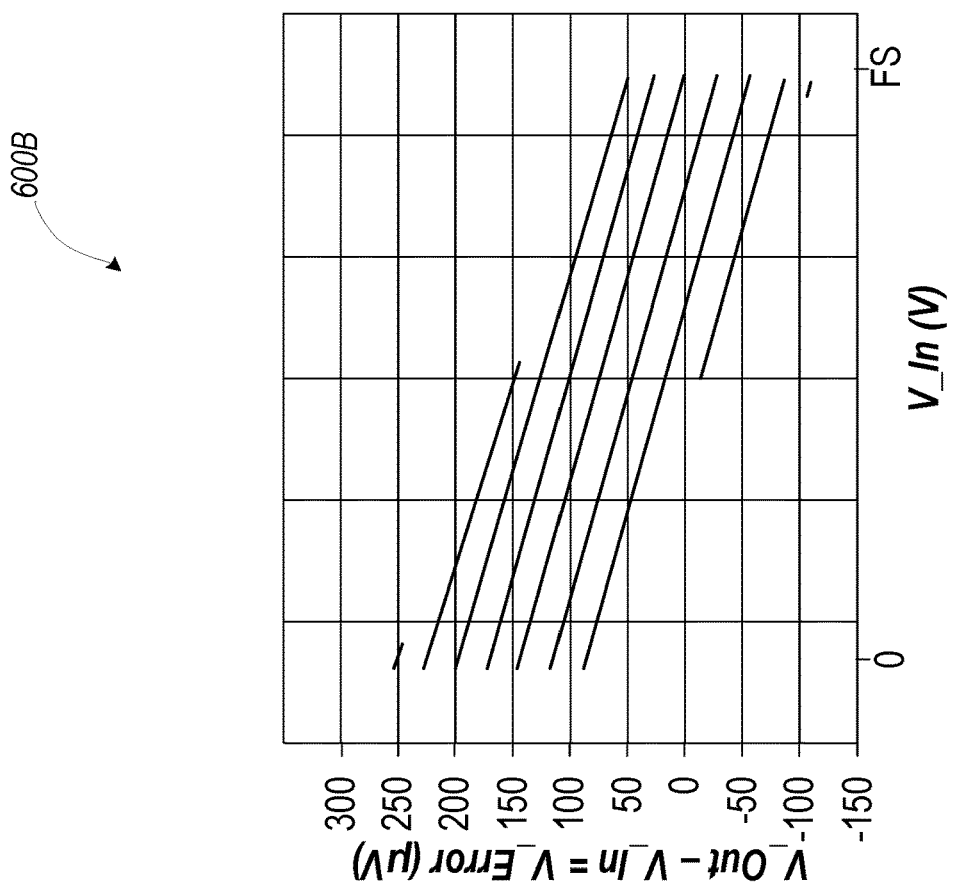
FIGS. 6A and 6B show a laboratory-measured example of an uncalibrated ADC measurement and a measurement from an ADC calibrated using internal calibration.
Figure 6A:
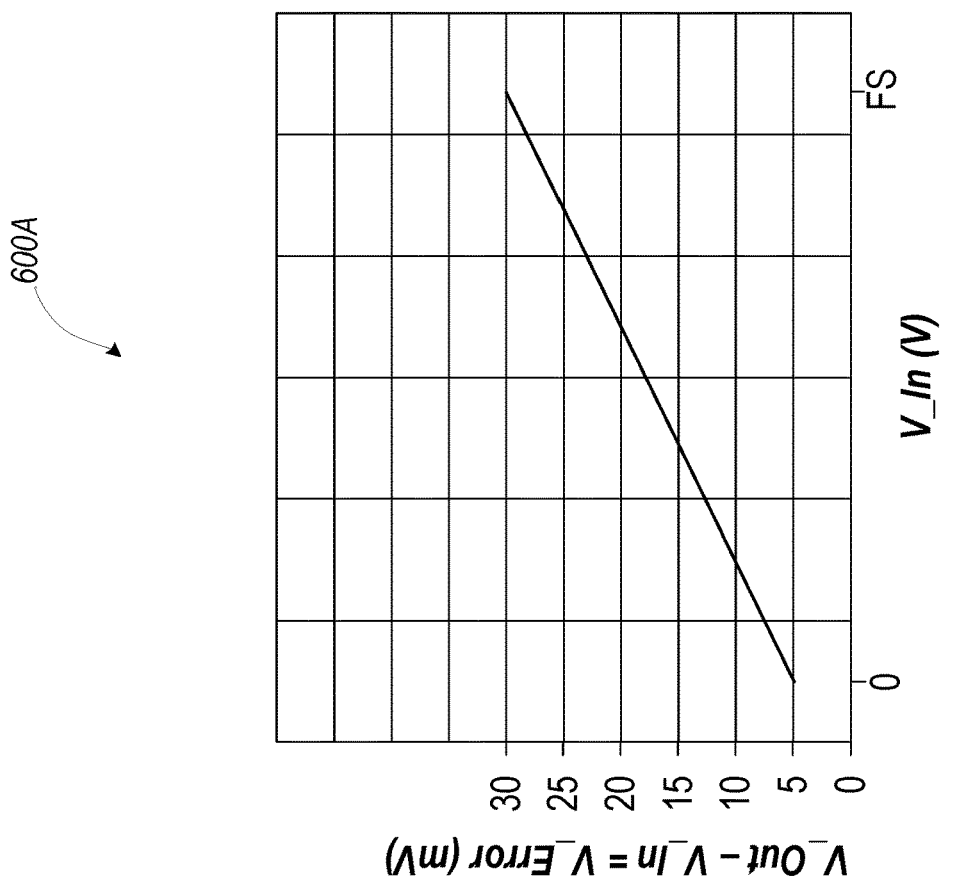

FIGS. 6A and 6B show a laboratory-measured example of an uncalibrated ADC measurement 600A in FIG. 6A and a measurement 600B from an ADC calibrated using a calibration method of the present disclosure in FIG. 6B. In the example of FIGS. 6A and 6B, the analog signal input 132 of the internal ADC 130 from 0V to the full-scale voltage is shown on the horizontal axis, and the error in the measurement is shown on the vertical axis. The error in the measurement is calculated by subtracting the value of the input voltage from measured value returned by the internal ADC 130.

In the uncorrected example of FIG. 6A, the error ranges from approximately 5 mV to 30 mV across the measurement range. In the corrected example of FIG. 6B, the error ranges from approximately −100 µV to 250 µV. FIG. 6B may show measurement artifacts, such as aliasing, possibly due to the error value being below the measurement range of the laboratory instruments used.

FIG. 7 is a flow chart 700 showing an example of a method for operating portions of an ADC system, such as the ADC system 100 shown in FIG. 1. At 702—a measured first reference value can be received, such as corresponding to a first internal reference voltage of an ADC system measured by an external voltage measurement device. At 704—a measured second reference value can be received, such as corresponding to a first internal reference voltage of an ADC system measured by an external voltage measurement device. At 706—a first internal reference voltage can be applied to an input of an internal ADC to generate a resulting first calibration value. At 708—a second internal reference voltage can be applied to an input of an internal ADC to generate a resulting second calibration value. At 710—a measured signal value of an analog signal of interest can be applied to the input of the internal ADC. At 712—a corrected value can be provided, such as corresponding to the measured signal value, using the first reference value, the second reference value, the first calibration value, the second calibration value, and the measured signal value. The shown order of steps is not intended to be a limitation on the order the steps are performed in. In an example, two or more steps may be performed simultaneously or at least partially concurrently.

702 and 704 may involve receiving reference values that were measured by an external voltage measurement device such as during a factory characterization mode. The reference values may be stored in memory 170 within the ADC system 100, and the values may be stored in a format corresponding to a voltage value, such as a floating point number, or a value corresponding to an ADC digital output value, such as an integer number of bits.

706, 708, and 710 may occur during a post-manufacturing end-user operational mode, such as during a calibration of the ADC system 100. 712 may be performed using software, or may be performed partially or completely on hardwire digital logic. 712 may involve mapping the mapping the measured signal value from a measured ADC curve towards an ideal ADC curve to obtain the corrected value.

Figure 8:
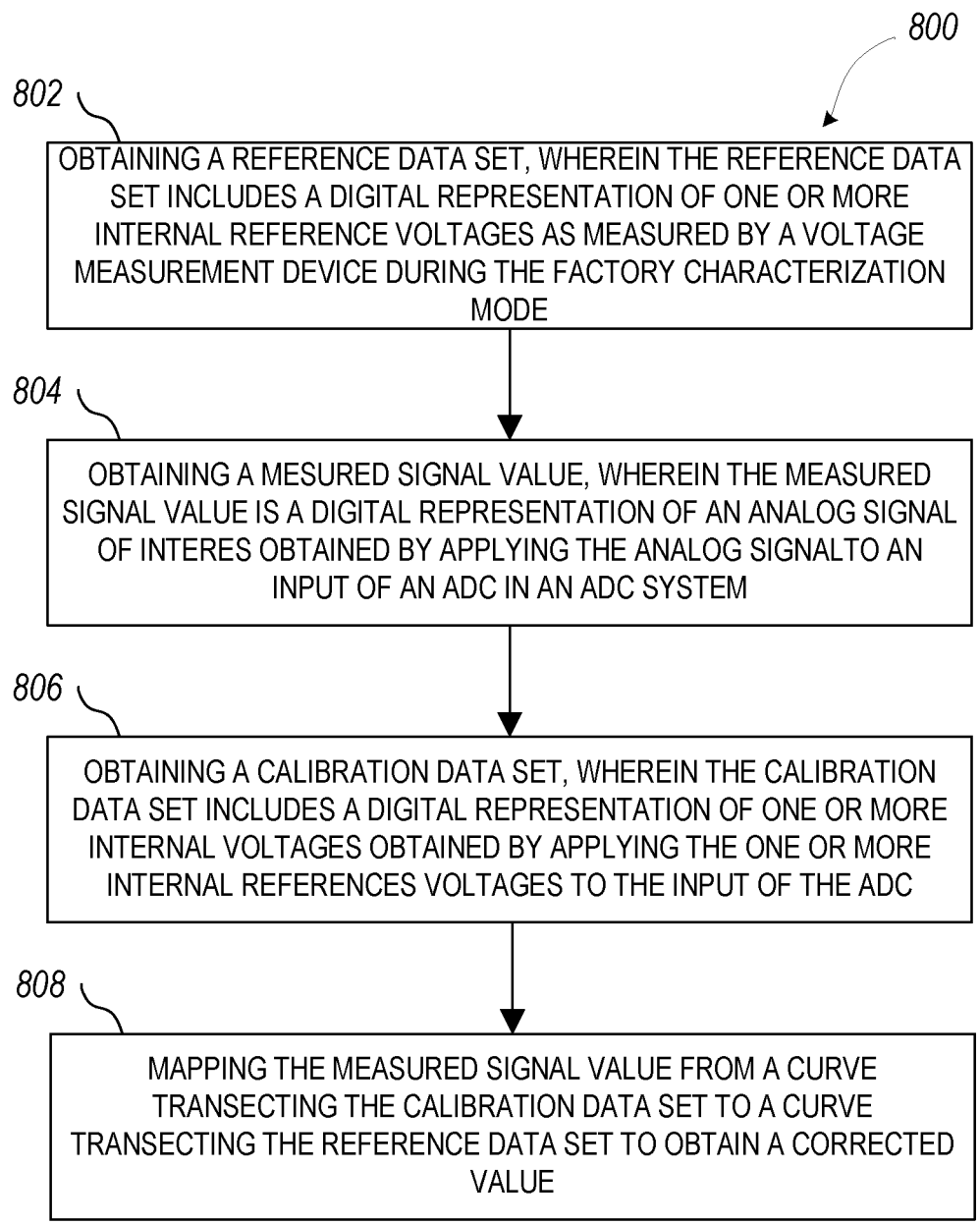
FIG. 8 is a flow chart showing an example of a method for operating portions of an ADC system.

FIG. 8 is a flow chart 800 showing an example of a method for operating portions of an ADC system, such as the ADC system 100 shown in FIG. 1. At 802—a reference data set can be obtained, wherein the reference data set includes a digital representation of one or more internal reference voltages as measured by a voltage measurement device during the factory characterization mode. At 804—a measured signal value can be obtained, wherein the measured signal value is a digital representation of an analog signal of interest obtained by applying the analog signal of interest to an input of an ADC in the ADC system. At 806—a calibration data set can be obtained, wherein the calibration data set includes a digital representation of the one or more internal reference voltages obtained by applying the one or more internal reference voltages to the input of the ADC. At 808—the measured signal value can be mapped from a curve transecting the calibration data set to a curve transecting the reference data set to obtain a corrected value. The shown order of steps is not intended to be a limitation on the order the steps are performed in. In an example, two or more steps may be performed simultaneously or at least partially concurrently.

The reference data set obtained at 802 may be from values stored in memory 170 during a factory characterization mode. The calibration data set obtained at 806 and measured signal value obtained at 804 may be obtained during a post-manufacturing end-user operational mode. The reference data set obtained at 802 may have the same number of values as the calibration data set obtained at 806, or the data sets may differ in size. In an example, the reference data set and the calibration data set may both contain two points, and the mapping at 808 may involve mapping the measured signal value from a substantially linear measured ADC curve transecting the two points in the calibration data set to a corresponding point on a substantially linear ideal ADC curve transecting the two points in the reference data set. The mapping may include calculating one or more of a slope or intercept difference between the measured ADC curve and the ideal ADC curve.

The systems, techniques, and methods described herein are believed to apply, at least in part, to a variety of ADC systems, such as voltage ADCs and current ADCs.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for operating an analog-to-digital converter (ADC) system, the method comprising:
receiving a measured first reference value corresponding to a first internal reference voltage of the ADC system measured by an external voltage measurement device;
receiving a measured second reference value corresponding to a second internal reference voltage of the ADC system measured by the external voltage measurement device;
applying the first internal reference voltage to an input of an internal ADC to generate a resulting first calibration value;
applying the second internal reference voltage to the input of the internal ADC to generate a resulting second calibration value;
measuring a signal value of an analog signal of interest applied to the input of the internal ADC; and
providing a corrected value, corresponding to the measured signal value, using the first reference value, the second reference value, the first calibration value, the second calibration value, and the measured signal value.

2. The method of claim 1, wherein the first internal reference voltage and the second internal reference voltage are provided by a bandgap voltage generation circuit.

3. The method of claim 1, wherein, when the measured first reference value and the measured second reference value are measured by the external voltage measurement device, an analog signal chain of the internal ADC is connected in parallel with the external voltage measurement device.

4. The method of claim 3, wherein the first reference value and the second reference value are adjusted for at least one of an inductance or a resistance value of one or more bond wires that provide the first internal reference voltage and second reference voltage to the external voltage measurement device.

5. The method of claim 1, comprising at least one of storing or retrieving the first reference value and the second reference value using a non-volatile memory.

6. The method of claim 1, wherein the measuring a first calibration value and the measuring a second calibration value are performed between (1) at least once for every time that the measured signal value is measured and (2) at least once for every 10,000 times that the measured signal value is measured.

7. The method of claim 1, wherein the measuring a first calibration value and the measuring a second calibration value occurs between (1) at least once every 1 microsecond and (2) at least once every 200 microseconds.

8. The method of claim 1, wherein the measuring a first calibration value and the measuring a second calibration value occurs during a post-manufacturing end-user operational mode and uses the measured first reference value and the measured second reference value being measured and stored during a factory characterization mode that occurs at or with manufacturing.

9. The method of claim 1, wherein the providing a corrected value comprises mapping the measured signal value from a measured curve to a reference curve, wherein the measured curve includes the first calibration value and the second calibration value and the reference curve includes the first reference value and the second reference value.

10. The method of claim 9, wherein the measured curve and the reference curve are both substantially linear lines.

11. The method of claim 10, wherein the mapping the measured signal value from a measured curve to a reference curve comprises obtaining (1) at least one of a slope or a gain difference and (2) at least one of an offset or intercept difference between the measured curve and the reference curve.

12. An analog-to-digital converter (ADC) system for providing a calibrated voltage measurement without an external reference voltage, the ADC system comprising:
an ADC circuit, including an analog ADC input and a digital ADC output;
circuitry to generate a first internal reference voltage and a second internal reference voltage; and
circuitry configured to provide a selected output from a number of inputs, wherein the inputs include inputs to receive (1) the first internal reference voltage, (2) the second internal reference voltage, and (3) a user-provided analog signal of interest, wherein the selected output can be connected to the analog ADC input, an external voltage measurement device, or both.

13. The ADC system of claim 12, further comprising circuitry to adjust a measured value of the analog signal of interest measured by the ADC.

14. The ADC system of claim 13, wherein the circuitry to adjust the measured value of the analog signal of interest is not software based.

15. The ADC system of claim 12, wherein the first internal reference voltage and the second internal reference voltage are provided by a bandgap voltage generation circuit.

16. A method of operating an analog-to-digital converter (ADC) system with a factory characterization mode and an end-user operational mode, the method comprising:
during the end-user operational mode:
obtaining a reference data set, wherein the reference data set includes a digital representation of one or more internal reference voltages as measured by a voltage measurement device during the factory characterization mode;
obtaining a measured signal value, wherein the measured signal value is a digital representation of an analog signal of interest obtained by applying the analog signal of interest to an input of an ADC in the ADC system;
obtaining a calibration data set, wherein the calibration data set includes a digital representation of the one or more internal reference voltages obtained by applying the one or more internal reference voltages to the input of the ADC; and mapping the measured signal value from a curve transecting the calibration data set to a curve transecting the reference data set to obtain a corrected value.

17. The method of claim 16, wherein the one or more internal reference voltages number two, and the curve transecting the calibration data set and the curve transecting the reference data set are both substantially linear.

18. The method of claim 17, wherein the mapping the measured signal value includes determining (1) at least one of a slope or a gain correction and (2) at least one or an offset or intercept correction between the curve transecting the calibration data set and the curve transecting the reference data set.

19. The method of claim 16, wherein the obtaining a calibration data set occurs between (1) at least once for every time the obtaining a measured signal value occurs and (2) at least once for every 10,000 times the obtaining a measured signal value occurs.

20. The method of claim 16, wherein the voltage measurement device used during the factory characterization mode has a precision exceeding a desired precision of the corrected value in the end-user operational mode.

* * * * *